(12) United States Patent
Smith et al.

(10) Patent No.: US 8,292,217 B2
(45) Date of Patent: Oct. 23, 2012

(54) HYPERSONIC INLET SYSTEMS AND METHODS

(75) Inventors: Thomas R. Smith, Westminster, CA (US); Angel M. Espinosa, St. Charles, MO (US); Daniel J. Farrell, St. Louis, MO (US); Andrew Robertson, West Sayville, NY (US); John C. Leylegian, White Plains, NY (US); Jason S. Tyll, Blue Point, NY (US); Florin Girlea, Flushing, NY (US); Joseph A. Alifano, Ronkonkoma, NY (US); Randy S. M. Chue, Bohemia, NY (US)

(73) Assignee: The Boeing Company, Chicago, IL (US)

( * ) Notice: Subject to any disclaimer, the term of this patent is extended or adjusted under 35 U.S.C. 154(b) by 1174 days.

(21) Appl. No.: 12/133,289

(22) Filed: Jun. 4, 2008

(65) Prior Publication Data

US 2009/0313968 A1 Dec. 24, 2009

Related U.S. Application Data

(60) Provisional application No. 60/942,186, filed on Jun. 5, 2007.

(51) Int. Cl.
*B64D 33/02* (2006.01)
*F02K 7/08* (2006.01)
*F02K 7/10* (2006.01)

(52) U.S. Cl. ........................................ 244/53 B; 60/768

(58) Field of Classification Search ................ 244/53 B; 137/15.1, 15.2; 60/767, 768, 224

See application file for complete search history.

(56) References Cited

U.S. PATENT DOCUMENTS

| 3,103,102 | A | * | 9/1963 | Sargent et al. ................. 60/224 |
| 3,941,336 | A | * | 3/1976 | Nangia ........................ 244/53 B |
| 2006/0266412 | A1 | * | 11/2006 | Lundy et al. ................. 137/15.2 |

OTHER PUBLICATIONS

Beckwith et al., "The Aerodynamic Design of High Mach Number Nozzles Utilizing Axisymmetric Flow with Application to a Nozzle of Square Test Section", NACA Technical Note 2711, NACA, Jun. 1952, 31 pgs.
Billing et al., "Comparison of Planar and Axisymmetric Flowpaths for Hydrogen Fueled Space Access Vehicles", AIAA Paper 2003-4407. AIAA, 2003, 12 pgs.
Drayna et al., "Hypersonic Inward Turning Inlets: Design and Optimization", AIAA Paper 2006-297, AIAA, 2006, 11 pgs.
Evvard et al, "Three-Dimensional Supersonic Nozzles and Inlets of Arbitrary Exit Cross Section", NACA Technical Note 2688, NACA, 1952, 13 pgs.

(Continued)

*Primary Examiner* — Ehud Gartenberg
*Assistant Examiner* — Carlos A Rivera
(74) *Attorney, Agent, or Firm* — Caven & Aghevli LLC

(57) ABSTRACT

Hypersonic inlet systems and methods are disclosed. In one embodiment, an inlet for an airbreathing propulsion system includes an inboard surface at least partially shaped to conform to a plurality of streamline-traces of a design flowfield approaching an aperture, an outboard surface spaced apart from the inboard surface, an upper surface extending between the inboard and outboard surfaces, and a lower surface extending between the inboard and outboard surfaces, wherein leading edges of the inboard, outboard, upper, and lower surfaces cooperatively define the aperture.

19 Claims, 5 Drawing Sheets

OTHER PUBLICATIONS

Smart, "Experimental Testing of a Hypersonic Inlet with Rectangular-to-Elliptical Shape Transition", AIAA Paper 99-0085, AIAA, 1999, 10 pgs.

Smart, "Experimental Testing of a Hypersonic Inlet with Rectangular-to-Elliptical Shape Transition", J. of Propulsion and Power, vol. 17, No. 2, 2001, AIAA, pp. 276-283.

Smart, "Design of Three-Dimensional Hypersonic Inlets with Rectangular-to-Elliptical Shape Transition", AIAA Journal of Propulsion and Power, vol. 15, No. 3, 1999, pp. 408-416.

Smart et al., "Free-jet Testing of a REST Scramjet at Off-Design Conditions", AIAA Paper 2006-2955, AIAA, 2006, 12 pgs.

Smart et al., "Mach 4 Performance of a Fixed-Geometry Hypersonic Inlet with Rectangular-to-Elliptical Shape Transition", AIAA Paper 2003-0012, AIAA, 2003, 11 pgs.

Smart et al., "Mach 4 Performance of Hypersonic Inlet with Rectangular-to-Elliptical Shape Transition", AIAA Journal of Propulsion and Power, vol. 20, No. 2, 2004, pp. 288-293.

* cited by examiner

HYPERSONIC INLET SYSTEMS AND METHODS

CROSS-REFERENCE TO RELATED APPLICATIONS

This application claims priority benefit from U.S. Provisional Patent Application No. 60/942,186, filed on Jun. 5, 2007, entitled "HYPERSONIC INLET SYSTEMS AND METHODS".

STATEMENT OF GOVERNMENT INTEREST

This invention was made with government support under subcontract number G1103-0002 to U.S. Government Contract NNL04AA01C awarded by the National Aeronautics and Space Administration. The U.S. Government has certain rights in this invention.

FIELD OF THE INVENTION

The present disclosure relates to airbreathing propulsion systems, and more specifically, to hypersonic inlet systems and methods.

BACKGROUND OF THE INVENTION

In order to operate efficiently, airbreathing hypersonic vehicles generally rely on at least two propulsion system types to complete their missions: one to propel the vehicle at relatively low speeds (Mach 0 to 3-4), and one to take over at higher speeds (Mach 3-4 to Mach 7-9 for hydrocarbon-fueled accelerator and cruise vehicles, and up to Mach 10-12 for hydrogen-fueled cruisers). The low-speed propulsion system is typically a turbine engine, designed to survive the thermal stresses of high-Mach operation and supply adequate thrust over the required speed range. High-speed thrust may be provided by a dual-mode ram/scramjet.

Integration of these propulsion systems on a hypersonic vehicle may be enhanced by a common Multi-Role Air Induction System (MRAIS) to supply the needs of both propulsion system types, creating a so-called "turbine-base combined cycle" (TBCC) propulsion system. Requirements for an MRAIS include supplying the required amount of air with adequate pressure recovery and sufficient operability margin for each propulsion system independently, and also during propulsion system transition from low-speed to high-speed operating mode. MRAIS efficient operation and smooth mode transition rely on a well-designed, highly integrated system of inlet variable geometry and bleed.

Prior art hypersonic inlet systems typically include variable geometry systems that are used to redirect and compress the incoming airflow during various portions of the vehicle's flight regime. Known hypersonic inlet systems include, for example, those systems disclosed in U.S. Pat. No. 5,054,288 issued to Salemann, and U.S. Pat. No. 5,337,975 issued to Peinemann. Typically, prior art TBCC inlets have relied upon a variable planar (or two-dimensional 2D) geometry integrated into an over/under arrangement, with the turbine flowpath being above the ramjet/scramjet flowpath, and having the turbine inlets external to, and forward of, the ramjet/scramjet inlet, while sharing a common external forebody. Typically, planar variable geometry features (e.g., flat flaps with effective sealing) have not been effectively integrated with inlets which are defined by axisymmetric flowfields. Axisymmetric flowfield inlets may offer benefits, including more efficient compression in converging (i.e., inward turning) flows, than 2-D flowfields which can have stronger shock waves and greater losses. Thus, although such prior art hypersonic inlet systems may provide desirable results, there is room for improvement.

SUMMARY OF THE INVENTION

The present invention is directed to hypersonic inlet systems and methods. Embodiments of the present invention may advantageously provide desired inlet capabilities, including supplying the required amount of air with adequate pressure recovery and sufficient operability margin for each propulsion system independently, and also during propulsion system transition from low-speed to high-speed operating mode, without a great deal of mechanical complexity.

In one embodiment, a method of designing an inlet for an airbreathing propulsion system includes establishing a design point flowfield, defining an aperture shape, tracing a plurality of streamlines around a perimeter of the aperture shape on the design flowfield to provide an intermediate shape, splitting the intermediate shape along a lateral centerline to provide a left lateral half and a right lateral half, and interchanging positions of the left lateral half and the right lateral half to form the inlet. In alternate embodiments, the design point flowfield may be an axisymmetric flowfield, and the aperture shape may be a two-dimensional (e.g. rectangular) shape.

In another embodiment, an inlet for an airbreathing propulsion system includes an inboard surface at least partially shaped to conform to a plurality of streamline-traces of a design flowfield approaching an aperture, an outboard surface spaced apart from the inboard surface, an upper surface extending between the inboard and outboard surfaces, and a lower surface extending between the inboard and outboard surfaces, wherein leading edges of the inboard, outboard, upper, and lower surfaces cooperatively define the aperture.

In a further embodiment, an airbreathing propulsion system includes an inlet assembly configured to receive an incoming airflow, the inlet assembly including a left inlet and a right inlet, each of the left and right inlets including: an inboard surface at least partially shaped to conform to a plurality of streamline-traces of a design flowfield downstream from an aperture; an outboard surface spaced apart from the inboard surface, the outboard surface comprising a movable high-speed flap; an upper surface extending between the inboard and outboard surfaces; a lower surface extending between the inboard and outboard surfaces, wherein leading edges of the inboard, outboard, upper, and lower surfaces cooperatively define the aperture; and a moveable low-speed flap spaced apart in an inboard direction from the high-speed flap. The system further including a low-speed diffuser duct operatively coupled to the inlet assembly, the moveable low-speed flap being configured to at least partially control a first airflow into the low-speed diffuser duct; a high-speed diffuser duct operatively coupled to the inlet assembly outboard from the low-speed diffuser duct, the moveable high-speed flap being configured to at least partially control a second airflow into the high-speed diffuser duct; a low-speed jet engine coupled to the low-speed diffuser duct; and a high-speed jet engine coupled to the high-speed diffuser duct.

The features, functions, and advantages that have been discussed can be achieved independently in various embodiments of the present invention or may be combined in yet other embodiments further details of which can be seen with reference to the following description and drawings.

BRIEF DESCRIPTION OF THE DRAWINGS

Embodiments of the present invention are described in detail below with reference to the following drawings.

DETAILED DESCRIPTION

The present invention relates to hypersonic inlet systems and methods. Many specific details of certain embodiments of the invention are set forth in the following description and in FIGS. 1-6 to provide a thorough understanding of such embodiments. The present invention, however, may have additional embodiments, or may be practiced without one or more of the details described below.

As described above, prior art turbine-based combined cycle (TBCC) inlets have traditionally relied upon a more purely planar (or two-dimensional 2D) geometry as integrated into an over/under arrangement, with the turbine flowpath being above the ramjet/scramjet flowpath. Also, the prior art approach generally had the turbine inlets external to, and forward of, the ramjet/scramjet inlet, while sharing a common external forebody, which facilitated incorporation of planar variable geometry.

In general, embodiments of the present invention anchor to a potentially higher-performing streamline-traced inlet from an axisymmetric flowfield while combining this with a rectangular aperture to facilitate planar variable geometry (e.g., planar flaps) without increasing mechanical complexity. By movement of one or more flaps, each of the turbine inlets is moveable between a retracted position wherein there is relatively smaller or zero flow entering the turbine, and a deflected position wherein there is relatively greater flow from the ramjet/scramjet inlet entering the turbine. The resulting integration has the turbine and ramjet/scramjet flowpaths side by side instead of one over the other.

Figure 1:
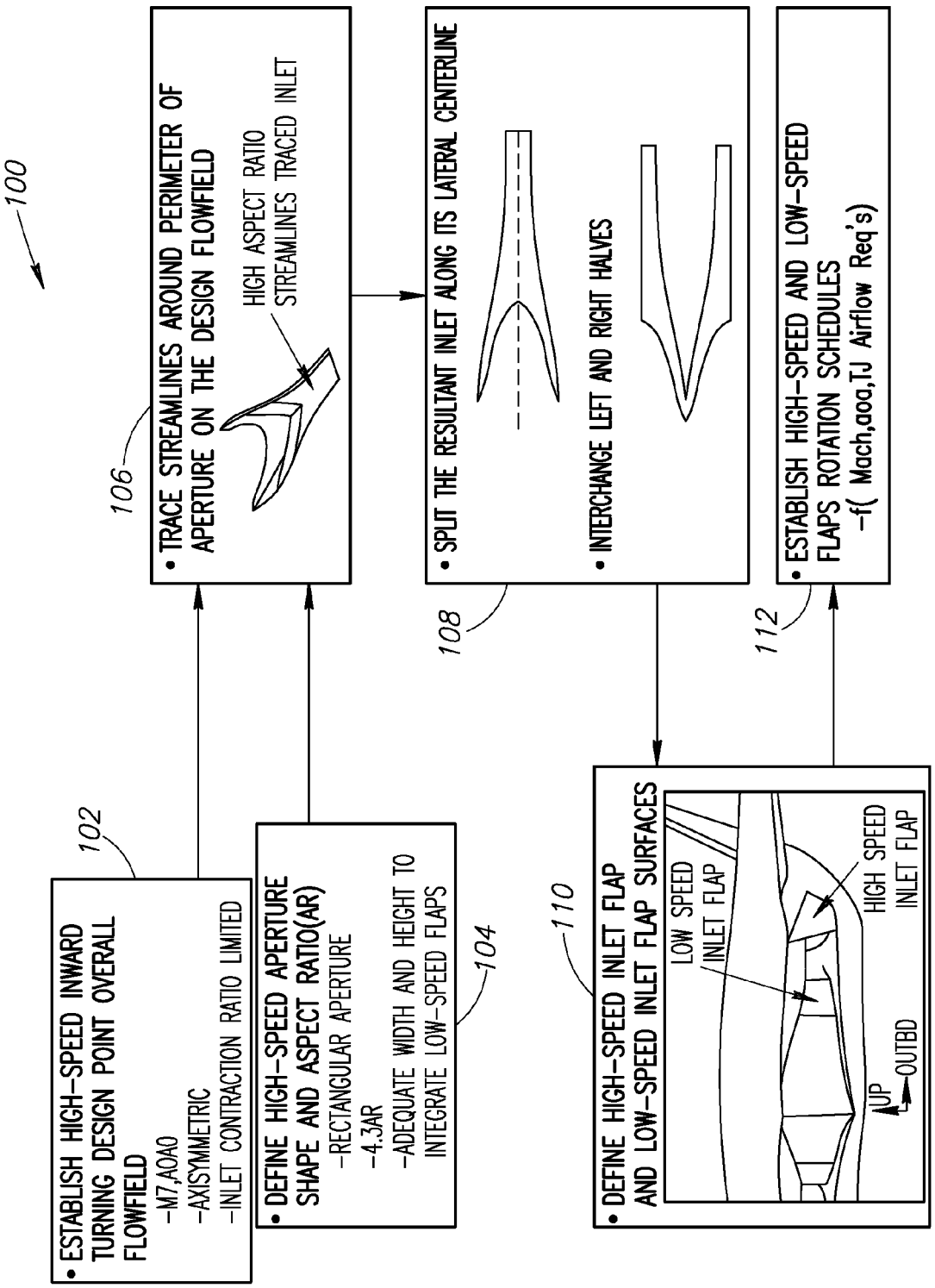
FIG. 1 is a schematic view of a hypersonic inlet design process in accordance with an embodiment of the invention.

FIG. 1 is a schematic view of a hypersonic inlet design process 100 in accordance with an embodiment of the invention. The design process 100 provides a single air induction system for the simultaneous or independent operation of a high-speed ram/scramjet and a separate low-speed turbine engine system. As shown in FIG. 1, in this embodiment, the design process 100 includes establishing a high-speed inward turning design point overall flowfield at a block 102. The design point overall flowfield is preferably axisymmetric. As know to those skilled in the art, an axisymmetric flowfield is generally uniform and permits definition of flow properties by reference to a single dimension (e.g., a radial distance). The flowfield is defined by conducting a suitable and conventional flow analysis, such as using a computational fluid dynamics (CFD) code in a two-dimensional mode and with axisymetric boundary conditions. An idealized, converging inlet contour is modeled between a capture plane and a throat plane to define an initial pattern of shock waves in the flowfield.

In one particular embodiment, the freestream Mach number of the design point overall flowfield is Mach 7. At a block 104, a high-speed aperture shape and aspect ratio (AR) are defined. The aperture shape may be rectangular, and preferably provides adequate width and height to integrate low-speed flaps. In one particular embodiment, the aspect ratio AR is 4.3. A rectangular shape facilitates an effective integration of planar flaps for variable geometry, although other shapes (e.g., trapezoids, non-uniform shapes) may be used. Other design Mach numbers and aperture dimension ratios do not depart from the scope of the invention.

The results of establishing the high-speed inward turning design point overall flowfield (block 102) and defining the high-speed aperture shape and aspect ratio AR (block 104) are used to trace streamlines around a perimeter of the aperture on the design flowfield at a block 106. As known to those skilled in the art, the perimeter of the aperture is projected longitudinally to intersect with the flowfield definition, particularly with the initial shock wave. Streamlines are then traced downstream from the points of intersection as they would flow in the established flowfield. The streamlines collectively define a streamtube forming a favorable inlet contour (the inlet of one embodiment being shown in block 106 of FIG. 1).

Next, the resultant streamline traced inlet is split along its lateral centerline, and the left and right halves are interchanged, at a block 108. The interchanging of the halves may provide these advantages: 1) a larger average width for incorporating the turbine inlet and duct without degrading performance; 2) improved structural efficiency and avoidance of relatively thin, cantilevered forward portions; and 3) a more open inlet which may facilitate free bleed of flow and avoid trapping shock waves for improved operability. As further shown in FIG. 1, the high-speed and low-speed inlet flap surfaces are defined at a block 110. Finally, the high-speed and low-speed flap rotation schedules are established at a block 112. The flap schedules may be determined based on a variety of factors, including freestream Mach number, capture area to throat area contraction ratio AOA, and airflow requirements of the turbojet.

Figure 2:
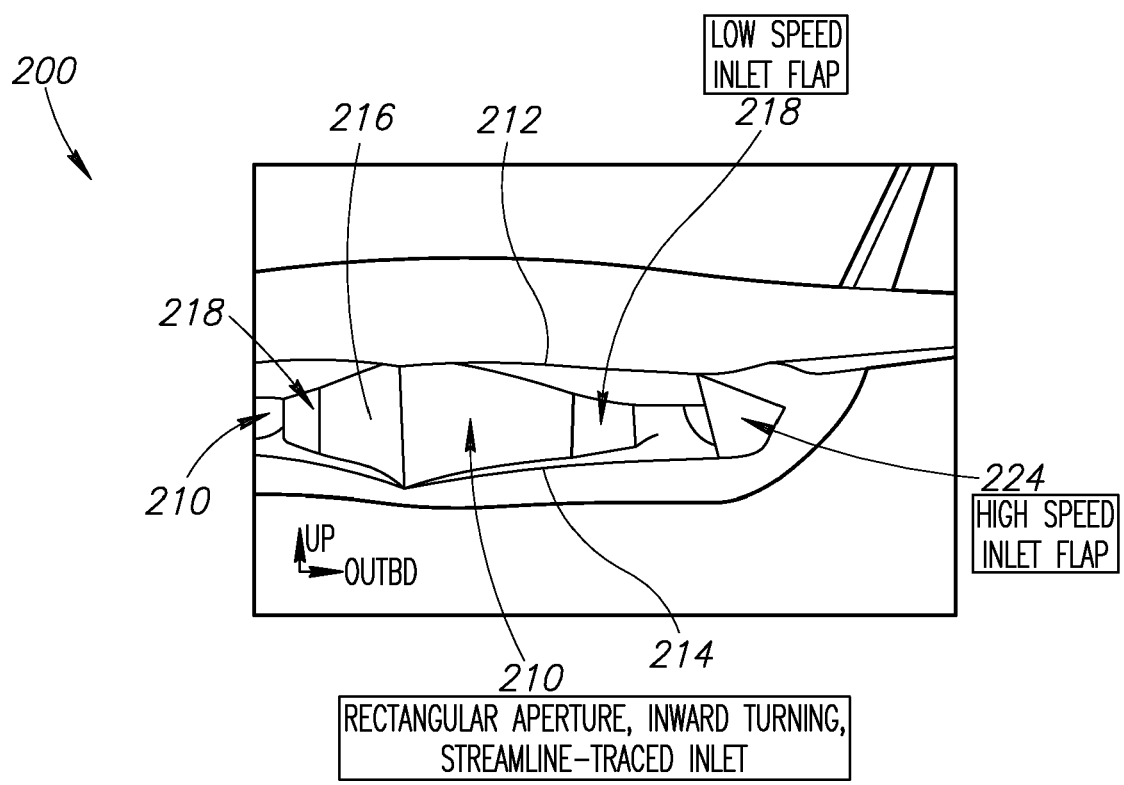
FIG. 2 is a front elevational view of a hypersonic vehicle having a hypersonic inlet in accordance with an embodiment of the invention.
Figure 3:
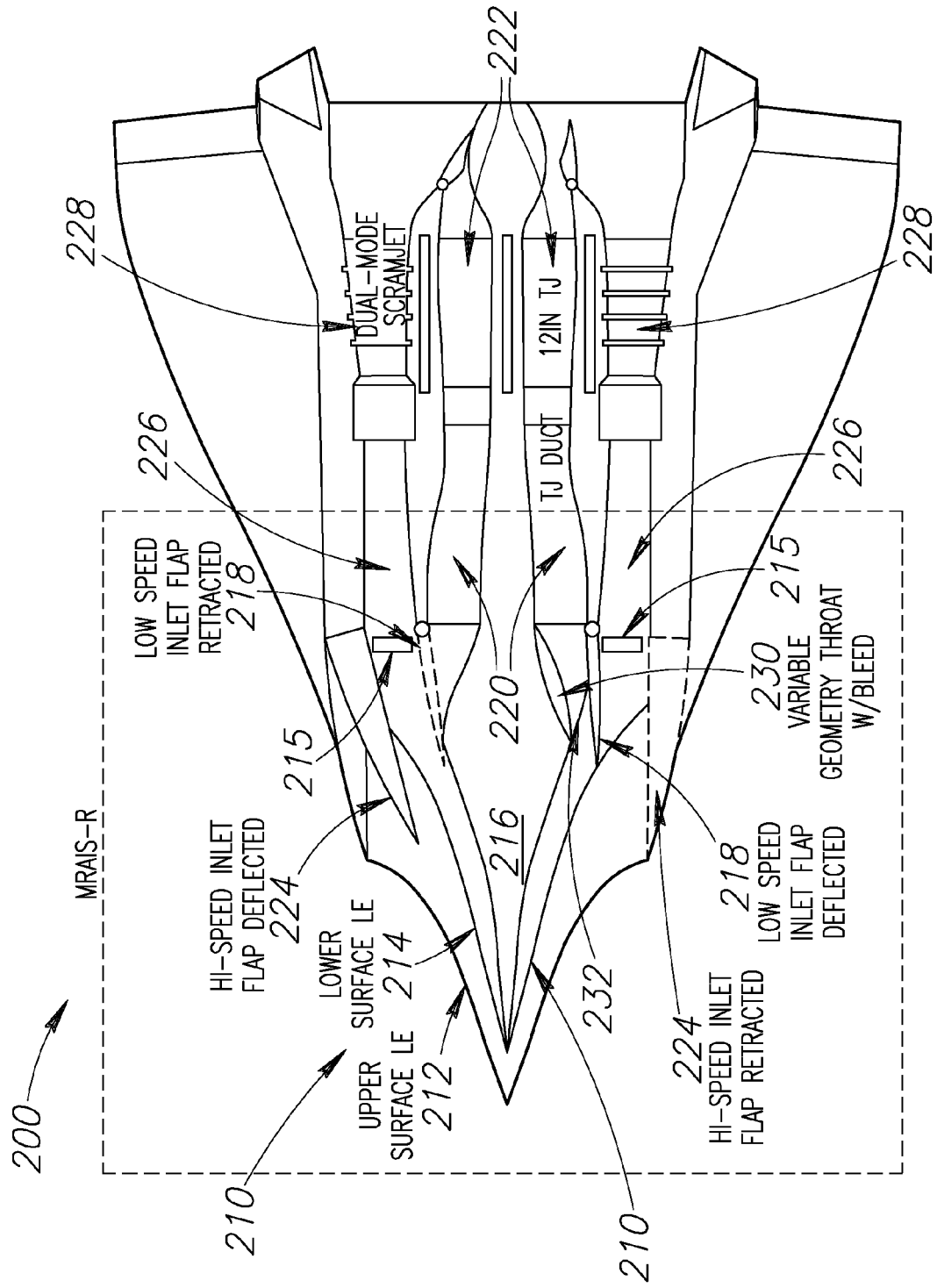
FIG. 3 is a top cross-sectional view of the hypersonic vehicle of FIG. 2.

FIG. 2 is a partial, front elevational view of a hypersonic vehicle 200 having a pair of inlets 210 in accordance with an embodiment of the invention. FIG. 3 is a top cross-sectional view of the hypersonic vehicle 200 of FIG. 2. As best shown in FIG. 2, the aperture of each inlet 210 is partially defined by an upper surface leading edge 212 and a lower surface leading edge 214. A centerbody 216 is positioned between the inlets 210. The shape of the surfaces of the centerbody 216 is defined by the interchanging of the positions of the left and right halves of the resultant shape defined by the streamline-tracing described above with respect to FIG. 1 (block 108).

Each inlet 210 further includes a low-speed inlet flap 218 configured to selectively open and close a low-speed diffuser duct 220 leading to a turbojet engine 222. More specifically, in an open position (see lower flap 218 of FIG. 3), the low-speed inlet flap 218 is rotated outwardly so that a portion of the captured airflow may pass to the turbojet engine 222 via the low-speed diffuser duct 220, while in a closed position (see upper flap 218 of FIG. 3), the low-speed inlet flap 218 is rotated inwardly so that the entrance to the low-speed diffuser duct 220 is blocked. Thus, the low-speed inlet flap 218 provides airflow capture and inlet operability control for the turbojet engine 222 during low-speed operation and transition.

As further shown in FIG. 3, the centerbody 216 may include one or more variable geometry regions 230. Preferably, the variable geometry regions 230 may be positioned proximate a throat region 232 leading into the low-speed diffuser duct 220 and may be equipped with one or more bleed regions 215 to enable proper control of the boundary layer, particularly at locations proximate to normal or oblique shock wave boundary layer interactions. The variable geometry regions 230 and bleed regions 215 may improve controllability and performance of the inlet 210, such as by permitting improved control of an expansion rate of the low-speed (e.g. subsonic) flow entering the low-speed diffuser duct 226. Other arrangements of components and variable geometry regions do not depart from the scope of this invention.

Each inlet 210 further includes a high-speed inlet flap 224 positioned along an outboard edge of the inlet 210. The high-speed inlet flap 224 is configured to selectively deflect toward the centerbody 216 to control airflow entering a high-speed diffuser duct 226 leading to a dual mode ramjet/scramjet engine 228. More specifically, in a deflected position (see upper flap 224 of FIG. 3), the high-speed inlet flap 224 is rotated inwardly, while in a retracted position (see lower flap 218 of FIG. 3), the high-speed inlet flap 224 is rotated outwardly. In this way, the high-speed inlet flap 224 controls inlet contraction ratio and operability during operation of the ramjet/scramjet engines 228.

Figure 4:
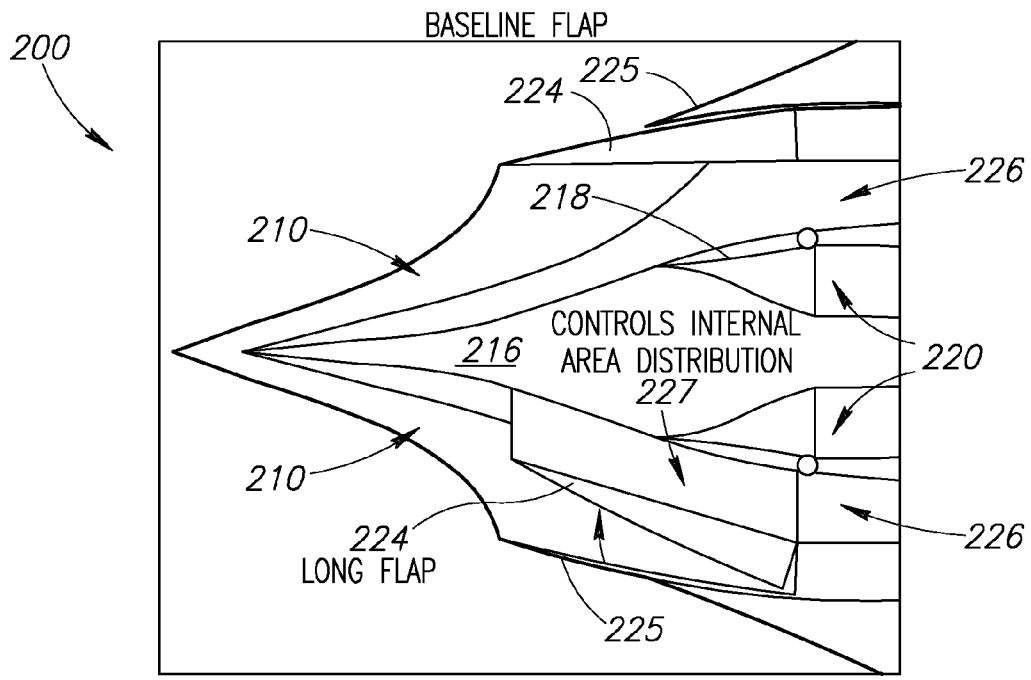
FIG. 4 is an enlarged top cross-sectional view of the hypersonic vehicle of FIG. 2.

FIG. 4 shows additional details of the high-speed inlet flaps 224. In this embodiment, the high-speed inlet flap 224 is a relatively longer flap that is positioned adjacent a fixed cowl 225 in the retracted position (see upper flap 224 of FIG. 4). In the deflected position (see lower flap 224 of FIG. 4), the high-speed inlet flap 224 is pivoted (i.e. inwardly turned) away from the fixed cowl 225 to control an internal area distribution within a compression zone 227 situated between the high-speed inlet flap 224 and the centerbody 216/low-speed inlet flap 218 surfaces.

Embodiments of the present invention may advantageously provide a streamline-traced hypersonic inlet which provides the necessary variable geometry without compromising overall system performance. Furthermore, embodiments of the present invention may provide the desired inlet capabilities, including supplying the required amount of air with adequate pressure recovery and sufficient operability margin for each propulsion system independently, and also during propulsion system transition from low-speed to high-speed operating mode, without a great deal of mechanical complexity.

It will be appreciated that a variety of alternate embodiments of the invention may be conceived, and that the invention is not limited to the particular embodiments described above. In the following discussion of alternate embodiments, components which remain unchanged from the previously described embodiments are designated with like reference numerals. For the sake of brevity, only substantial structural and operational differences from the previously-discussed embodiments will be described.

Figure 5:
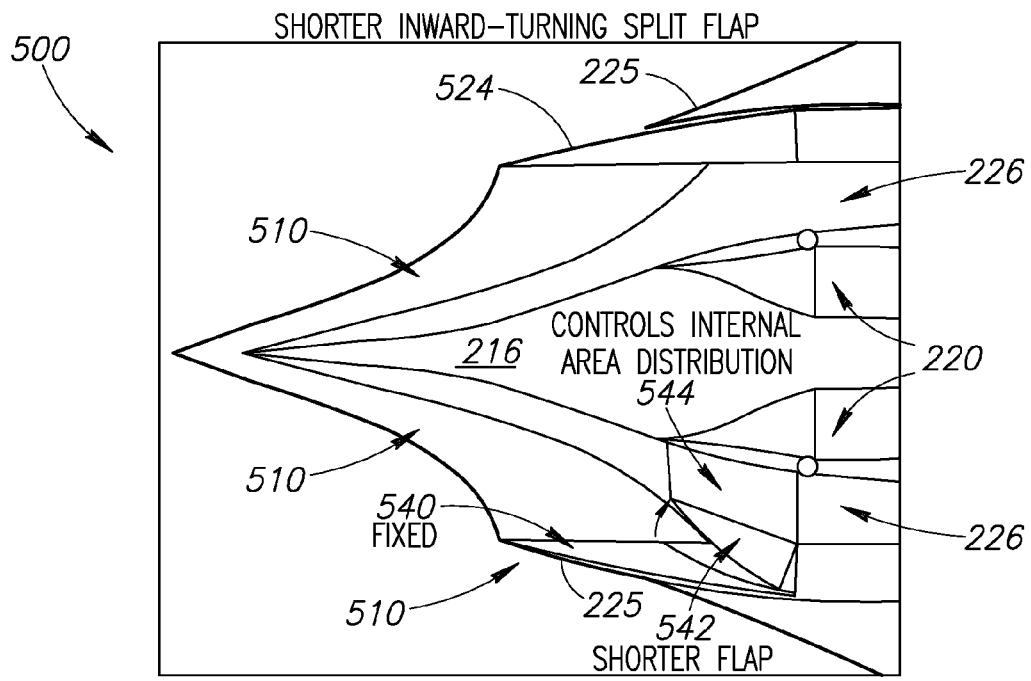
FIGS. 5 and 6 are top cross-sectional views of the hypersonic vehicle having streamline-traced hypersonic inlets in accordance with alternate embodiments of the invention.

FIG. 5 is a top cross-sectional view of a hypersonic vehicle 500 having streamline-traced hypersonic inlets 510 in accordance with an alternate embodiment of the invention. In this embodiment, each inlet 510 includes a high-speed inlet flap 524 having a first portion 540 and a second portion 542. In a first mode of operation, the first and second portions 540, 542 of the high-speed inlet flap 524 remain coupled together (see upper flap 524 of FIG. 5), and the high-speed inlet flap 524 performs as described above with respect to the inlet 210 shown in FIG. 4.

In a second mode of operation, however, the first portion 540 remains fixed relative to the fixed cowl 225 (see lower flap 524 of FIG. 5), and the second portion 542 pivots (i.e. inwardly turns) independently of the first portion 540. As shown in FIG. 5, the second portion 542 does not extend to the leading edge of the fixed cowl 225. Consequently, in the deflected position (see lower flap 524 of FIG. 5), the second portion 542 of the high-speed inlet flap 524 controls an internal area distribution within a relatively-smaller compression zone 527 which, in this embodiment, is situated between the second portion 542 and the low-speed inlet flap 218.

Figure 6:
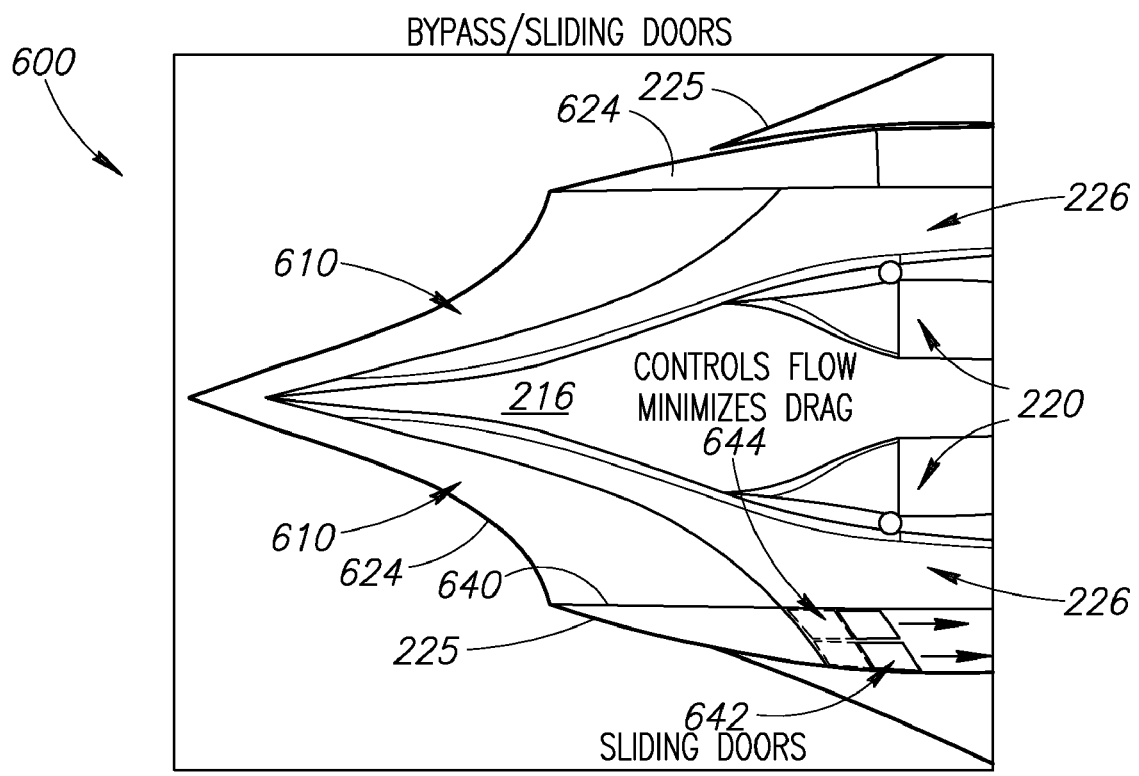

FIG. 6 is a top cross-sectional view of a hypersonic vehicle 600 having streamline-traced hypersonic inlets 610 in accordance with yet another embodiment of the invention. In this embodiment, each inlet 610 includes a high-speed inlet flap 624 having a first portion 640 and one or more second portions 642. In a first mode of operation, the first and second portions 640, 642 of the high-speed inlet flap 624 remain coupled together (see upper flap 624 of FIG. 6), and the high-speed inlet flap 624 performs as described above with respect to the inlet 210 shown in FIG. 4.

In a second mode of operation, however, the first portion 640 remains fixed relative to the fixed cowl 225 (see lower flap 624 of FIG. 6), and the second portion(s) 642 are actuated (e.g. by retracting fore or aft) independently of the first portion 640 to open up a bypass channel 644. Thus, in the second mode of operation, the second portion(s) 642 allow some of the captured flow to be bypassed, providing additional control of the flow entering the high-speed diffuser duct 226.

While preferred and alternate embodiments of the invention have been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

What is claimed is:

1. An inlet assembly for an airbreathing propulsion system, comprising:
a pair of inlets comprising separate apertures defined by an upper surface leading edge, a lower surface leading edge, and a centerbody disposed between the inlets, wherein the centerbody is at least partially shaped to conform to a plurality of streamline-traces of a design flowfield downstream from the apertures, wherein at least one of the pair of inlets comprises:
a low speed inlet flap configured to selectively open and close a low speed diffuser duct connected to a turbojet engine, wherein the low speed inlet flap rotates outwardly from the centerbody, from a first inboard position in which the low speed inlet flap closes the low speed diffuser duct, to a second outboard position in which the low speed inlet flap opens the low speed diffuser duct;
a high speed inlet flap positioned along an outboard edge and configured to selectively deflect toward the centerbody to control airflow entering a high-speed diffuser duct connected to a dual mode ramjet/scramjet engine.

2. The inlet assembly of claim 1, wherein the low speed inlet flap rotates into an airflow in the inlet to open the low speed diffuser duct.

3. The inlet assembly of claim 1, wherein the high speed inlet flap is positioned against a fixed cowl and rotates inwardly toward the centerbody from a first position in which the high speed inlet flap is retracted to a second position in which the high speed inlet flap regulates an airflow into the high speed diffuser duct.

4. The inlet assembly of claim 1, wherein:
the high speed inlet flap has a first portion and a second portion; and
the second portion pivots independently of the first portion to control an internal area distribution within a compression zone.

5. The inlet assembly of claim 1, wherein:
the high speed inlet flap has a first portion and a second portion; and
the second portion retracts independently of the first portion to selectively open and close a bypass channel.

6. The inlet assembly of claim 1, wherein the centerbody defines:
at least one variable geometry region proximate a throat region leading to the low speed diffuser duct; and
at least one bleed region.

7. The inlet assembly of claim 6, wherein the variable geometry regions and bleed regions enable control of an expansion rate of a subsonic flow entering the high speed diffuser duct.

8. An airbreathing propulsion system comprising:
a pair of inlets comprising separate apertures defined by an upper surface leading edge, a lower surface leading edge, and a centerbody disposed between the inlets, wherein the centerbody is at least partially shaped to conform to a plurality of streamline-traces of a design flowfield downstream from the apertures, wherein at least one of the pair of inlets comprises:
a low speed inlet flap configured to selectively open and close a low speed diffuser duct, wherein the low speed inlet flap rotates outwardly form the centerbody, from a first inboard position in which the low speed inlet flap closes the low speed diffuser duct, to a second outboard position in which the low speed inlet flap opens the low speed diffuser duct;
a high speed inlet flap positioned along an outboard edge and configured to selectively deflect toward the centerbody to control airflow entering a high-speed diffuser duct;
a turbojet engine connected to the low speed diffuser duct; and
a dual mode ramjet/scramjet engine connected to the high speed diffuser duct.

9. The airbreathing propulsion system of claim 8, wherein the low speed inlet flap rotates into an airflow in the inlet to open the low speed diffuser duct.

10. The airbreathing propulsion system of claim 8, wherein the high speed inlet flap is positioned against a fixed cowl and rotates inwardly toward the centerbody from a first position in which the high speed inlet flap is retracted to a second position in which the high speed inlet flap regulates an airflow into the high speed diffuser duct.

11. The airbreathing propulsion system of claim 8, wherein:
the high speed inlet flap has a first portion and a second portion; and
the second portion pivots independently of the first portion to control an internal area distribution within a compression zone.

12. The airbreathing propulsion system of claim 8, wherein:
the high speed inlet flap has a first portion and a second portion; and
the second portion retracts independently of the first portion to selectively open and close a bypass channel.

13. The airbreathing propulsion system of claim 8, wherein the centerbody defines:
at least one variable geometry region proximate a throat region leading to the low speed diffuser duct; and
at least one bleed region.

14. The airbreathing propulsion system of claim 13, wherein the variable geometry regions and bleed regions enable control of an expansion rate of a flow entering the high speed diffuser duct.

15. A method to operate an airbreathing propulsion system, comprising:
receiving an airflow into a pair of inlets comprising separate apertures defined by an upper surface leading edge, a lower surface leading edge, and a centerbody disposed between the inlets, wherein the centerbody is at least partially shaped to conform to a plurality of streamline-traces of a design flowfield downstream from the apertures;
activating a low speed inlet flap configured to selectively open and close a low speed diffuser duct connected to a turbojet engine, wherein the low speed inlet flap rotates outwardly, from the centerbody from a first inboard position in which the low speed inlet flap closes the low speed diffuser duct, to a second outboard position in which the low speed inlet flap opens the low speed diffuser duct; and
activating a high speed inlet flap positioned along an outboard edge and configured to selectively deflect toward the centerbody to control airflow entering a high-speed diffuser duct connected to a dual mode ramjet/scramjet engine.

16. The method of claim 15, wherein the low speed inlet flap rotates into an airflow in the inlet to open the low speed diffuser duct.

17. The method of claim 15, wherein the high speed inlet flap is positioned against a fixed cowl and rotates inwardly toward the centerbody from a first position in which the high speed inlet flap is retracted to a second position in which the high speed inlet flap regulates an airflow into the high speed diffuser duct.

18. The method of claim 15, wherein:
the high speed inlet flap has a first portion and a second portion; and
the second portion pivots independently of the first portion to control an internal area distribution within a compression zone.

19. The method of claim 15, wherein:
the high speed inlet flap has a first portion and a second portion; and
the second portion retracts independently of the first portion to selectively open and close a bypass channel.

* * * * *